United States Patent [19]

Baisuck et al.

[11] Patent Number: 5,440,720
[45] Date of Patent: Aug. 8, 1995

[54] ARCHITECTURE AND METHOD FOR DATA REDUCTION IN A SYSTEM FOR ANALYZING GEOMETRIC DATABASES

[75] Inventors: Allen Baisuck, San Jose, Calif.; Richard L. Fairbank, Schenectady, N.Y.; Walter K. Gowen, III, Troy, N.Y.; Jon R. Henriksen, Latham, N.Y.; William W. Hoover, III, Ballston Lake, N.Y.; Judith A. Huckabay, Union City; Eric Rogoyski, Los Gatos, both of Calif.; Anton G. Salecker, Clifton Park, N.Y.

[73] Assignee: Cadence Design Systems, Inc., San Jose, Calif.

[21] Appl. No.: 124,330

[22] Filed: Sep. 20, 1993

[51] Int. Cl.⁶ .................................................. G06F 17/50
[52] U.S. Cl. ....................................... 395/500; 364/489
[58] Field of Search ............... 364/489, 490, 491, 488, 364/578; 395/600, 500

[56] References Cited

U.S. PATENT DOCUMENTS

| | | | |
|---|---|---|---|
| 4,831,543 | 5/1989 | Mastellone | 364/489 |
| 4,924,385 | 5/1990 | Dote | 395/600 |
| 4,967,367 | 10/1990 | Piednoir | 364/489 |
| 5,050,091 | 9/1991 | Rubin | 364/488 |
| 5,150,308 | 9/1992 | Hooper et al. | 364/489 |
| 5,202,841 | 4/1993 | Tani | 364/491 |
| 5,210,699 | 5/1993 | Harrington | 364/488 |
| 5,212,650 | 5/1993 | Hooper et al. | 364/489 |
| 5,231,590 | 7/1993 | Kumar et al. | 364/491 |
| 5,249,265 | 9/1993 | Liang | 395/160 |
| 5,278,769 | 1/1994 | Bair et al. | 364/490 |
| 5,301,318 | 4/1994 | Mittal | 395/600 |
| 5,303,161 | 4/1994 | Burns et al. | 364/490 |
| 5,321,620 | 6/1994 | Tanaka | 364/468 |
| 5,349,659 | 9/1994 | Do et al. | 395/700 |

*Primary Examiner*—Parshotam S. Lall
*Assistant Examiner*—Viet Vu
*Attorney, Agent, or Firm*—John S. Ferrell; Leif R. Sloan

[57] ABSTRACT

A method and apparatus to enable the size reduction of geometric databases used in the analysis of integrated circuit layouts. The results of design rule analysis on the groups of polygon shapes comprising the integrated circuit layout are stored as either in-group results or override results in a dedicated result register memory. In-group results are design rule analysis results which contain only shapes contained in the group being analyzed. Override results are additional shape models produced when the spatial relationship between the shapes in the group being analyzed and shapes in lower level groups invalidate the results previously obtained for those lower level groups. The data base structure is created using a general purpose computer consisting of a CPU connected to a plurality of memories along a common data bus.

8 Claims, 11 Drawing Sheets

| GroupType | Information |
|---|---|
| Type 1 | Group 1 |
| Type 2 | Group 2 |
| | |
| Type n-1 | Group n-1 |
| Type n | Group n |

ARCHITECTURE AND METHOD FOR DATA REDUCTION IN A SYSTEM FOR ANALYZING GEOMETRIC DATABASES

CROSS-REFERENCE TO RELATED APPLICATIONS

The subject matter of this application is related to and incorporates by reference the subject matter of copending application Ser. No. 08/064,854, entitled "Verification Data Base Structure for Reducing Disk I/O in Integrated Circuit Design Analyzers," filed May 20, 1993, by Allen Baisuck, Richard L. Fairbank, Walter K. Gowen, III, Jon R. Henriksen, William W. Hoover, III, Judith A. Huckabay, Eric Rogoyoki, and Anton G. Salecker, and commonly assigned with the present invention.

BACKGROUND OF THE INVENTION

1. Field of the Invention

This invention relates to computer software and systems used in the design of electronic components and more particularly to a database structure contained within an integrated circuit analyzing computer which reduces the amount of storage memory required to contain database analysis results.

2. Description of the Background Art

An integral step in the design and production of integrated circuits involves the computer analysis of the Integrated Circuit (IC) design to verify that each of the geometrical design rules required for effective fabrication of the components is satisfied. These design rules include such parameters as the minimum feature size and the minimum distance between components. Analysis of these circuits has become increasingly difficult over the past decade as the number of electronic devices included on a single integrated circuit is counted in the millions. It is not uncommon for analysis of a complex integrated circuit to take many hours of computation time and require hundreds or thousands of megabytes of storage. Much effort in the past has been devoted to finding ways of performing this analysis more efficiently.

The large storage requirements of a typical IC database affect the cost of analysis in a variety of different ways. First, the memory requirements themselves impose constraints on the size of the integrated circuit that can be analyzed. Although memory costs continue to fall and are expected to do so in the future, the cost of storing data is a major element in the overall computational economics, since memory requires space, power, thermal management, archiving, maintenance and capital investment. Second, large databases require more processing time. Ultimately, each byte of data contained in a memory space affects the speed with which other bytes may be accessed and processed. As a mapped memory space increases, the processor requires increasing quantities of address data to locate any particular byte. It also follows that data in a database which is read and processed sequentially, requires more processing time as the database size increases. Finally, as database sizes increase, more expensive hardware architectures are required to deal with the increased memory space.

Clearly, smaller databases are computationally less expensive and more efficient to operate. In order to improve the efficiency of analyzing IC databases, a method and system is needed which reduces the database storage requirements.

SUMMARY OF THE INVENTION

In accordance with the present invention, a system and method are disclosed for reducing the size of the data set generated from the analysis of layout data used in the design and fabrication of integrated circuits. The invention generally involves the generation and use of a specialized register structure for storing analysis results. A results register is configured to compress design rule analysis results into fields containing in-group results and override results for each graph entry of the IC database examined. In-group results are analysis results which are derived only from the shapes found within the group type being analyzed. When in-groups results are produced, the results register stores only shape information identifying the type and geometrical placement of the shapes. If the spatial relationship between shapes in the group type being analyzed causes the lower level results to become invalidated, the new set of valid shapes created during the analysis is stored in the results register as override shapes. Result shapes which are not changed due to a specific analysis are called implicit results and are not duplicated in the database.

The structure of the present invention is implemented on a general purpose computer, such as a Sun workstation, manufactured by Sun Microsystems, Inc., Mountain View, Calif. The computer uses a Central Processing Unit (CPU) and one or more high speed internal memories which contain program instruction steps and provide storage for the database of the present invention. External disk storage is also used to contain original Circuit Data Base (CDB) data relating to the mask layout of the integrated circuit design being analyzed, and to store the Verification Data Base (VDB), which is actually used by the CPU in performing design analysis. A cell reference graph is created in which hierarchical relationships between the various cells are identified. This reference graph identifies a top cell and the hierarchical ordering of lower level cells contained within the IC layout. All cells in the IC layout are identified in a group model register. A group model is a collection of pointers to geometries in the shape model register and to other group models in the group model register. The lowest level cell components are called shapes and are efficiently stored in a shape model register.

The results register is implemented as a memory storage space connected to the CPU, and is used by the CPU to store design analysis results generated during IC layout processing. The results register preferably contains analysis results in the form of In-group results and override results. The override results contains address pointers to shape model library entries which represent shapes changed by the design analysis.

DESCRIPTION OF THE PREFERRED EMBODIMENT

Figure 1:
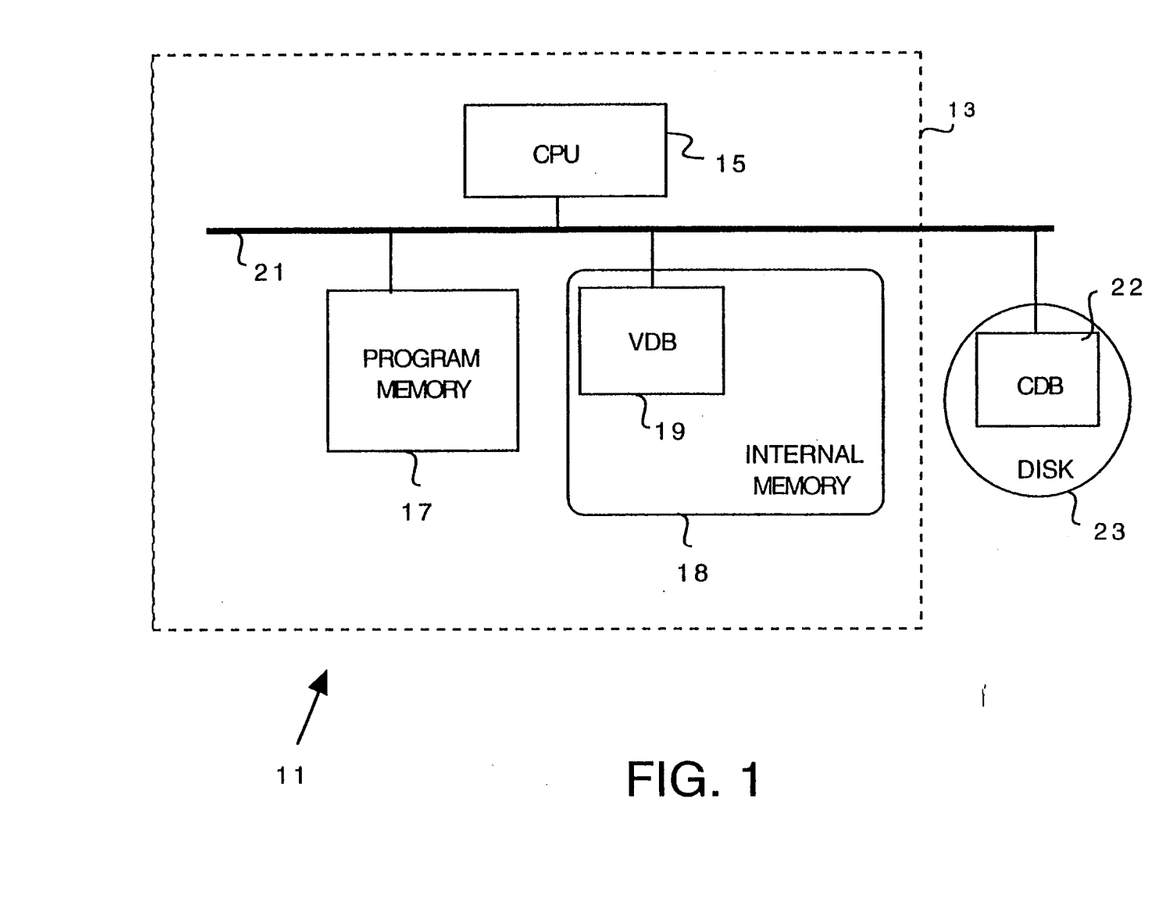
FIG. 1 is a block diagram showing the architecture of a preferred computing system used in the integrated circuit design analysis system of the present invention.

Referring now to FIG. 1, a system 11 is shown for analyzing Integrated Circuit (IC) designs. This figure of the high level architecture of the present system 11 shows a conventional general purpose computer 13, having a Central Processing Unit 15 attached via data bus 21 to program memory 17, internal memory 18, Verification Data Base (VDB) memory 19, and an external storage disk 23. IC designs generally consist of various lithographic mask layers which are used to produce etched regions of electronic activity within a substrate of crystalline semiconductor material. Each mask layer contains a plurality of geometric shapes for producing specific etched regions. Analysis of these mask layers is performed by examining coordinate representations of these shapes using system 11. The coordinate data is produced using a conventional digitizing or layout tool and stored in a format of listed numerical data, herein referred to as the Circuit Data Base (CDB) 22. This database is preferably arranged by cells, each cell representing a given area of the final design, and each comprised of references to shapes and other lower level cells. The shapes are represented as delimited strings of vertex coordinate points.

The CDB 22 is conventionally stored in system 11 on an external storage medium such as a disk 23. Since it is not uncommon for the circuit under analysis to contain millions of devices, the enormity of CDB 22 has traditionally made external storage the only practical means for containing this layout data (the strings of coordinates) during processing.

Figure 2:
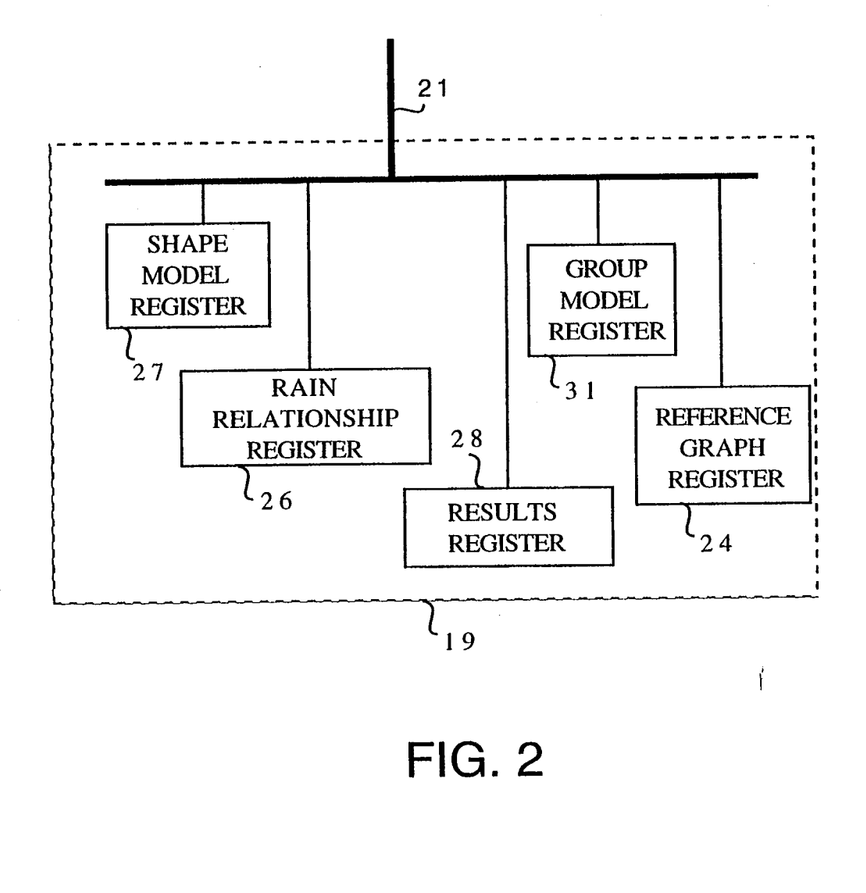
FIG. 2 is a block diagram showing an overview of the Verification Data Base (VDB) stored within the structure of FIG. 1.

Referring now to FIG. 2, a block diagram is shown for identifying the various components of the VDB 19. VDB 19 contains several major components: shape model register 27, group model register 31, reference graph register 24, results register 28, and rain relationship register 26. The shape model register 27 contains a library of all shapes used by the IC layout. Each shape used in the IC layout is listed only once in the shape model register 27. In this way, tremendous compression of the IC layout can be achieved, particularly in integrated circuits using large numbers of replicated cells, such as memories. The shapes are preferably listed in sequence according to frequency of instantiation in the cells of the CDB 22. Each shape model stored within shape model register 27 contains coordinate information identifying vertices of the specific shapes used in the IC layout.

Figure 3:
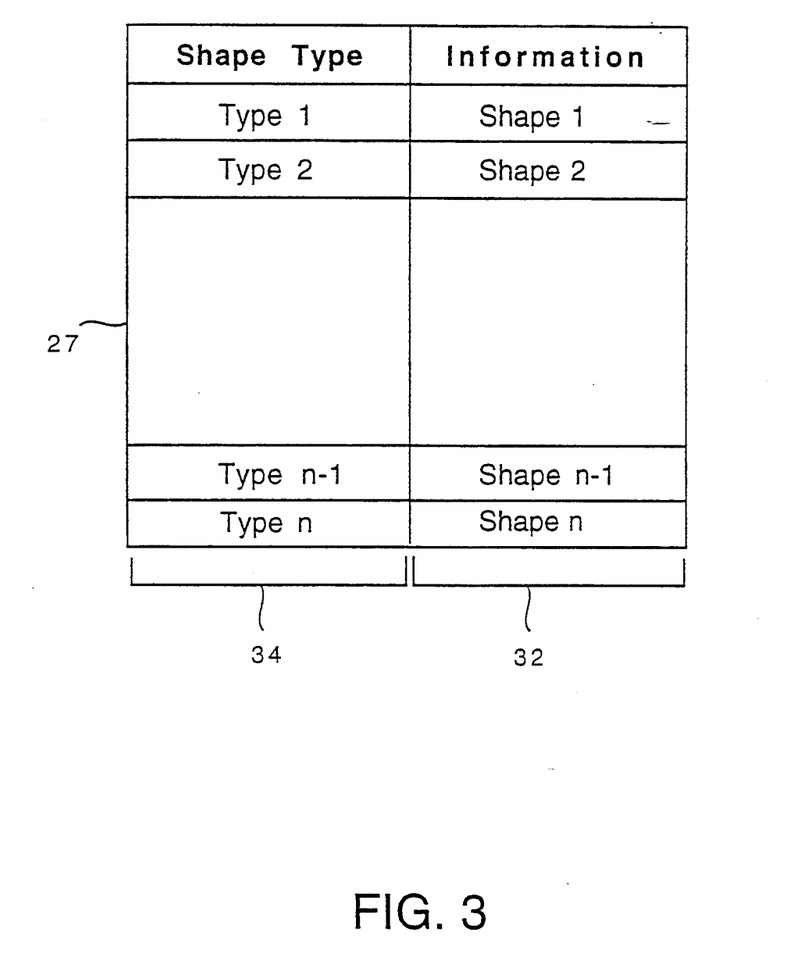
FIG. 3 is an overview memory map showing the organization of data stored in the shape model register of FIG. 2.

Referring also to FIG. 3, a memory map of the shape model register 27 is shown illustrating the arrangement of shape models within internal memory 18. Shape model register 27 is shown as a table consisting of a column of shape (model) types 34 and shape (model) information 32. Each shape type 34 shown in the memory map of FIG. 3, represents a distinct location in internal memory 18. Associated with each shape type 34, is a sequential listing of shape information 32. Only one instance of each shape of the integrated circuit layout is contained within the shape model register 27.

Referring again to FIG. 2, the VDB 19 also contains a group model register 31 for storing a library of group models. A group model represents an individual cell within the IC layout. Only one group model is used to represent a cell, regardless of the number of times that cell is referenced in the layout. Each group model 31 contains references to: (1) at least two shapes, (2) one or more other group models, or (3) at least one shape and one other group model. Each shape or group model reference is represented by a model identifier, a stamping point, and an orientation. The model identifier defines the shape or group as an existing shape model, or as an existing group model. The stamping point identifies the location of the model (whether a shape or group model) with respect to an absolute location within the cell that references that model. A cell that references a model is referred to as that model's "parent." The orientation defines the physical rotation of the model (shape or group) within the model's parent, and with respect to the stamping point of the model. For example, orientation "1" identifies a 90 degree clockwise orientation, orientation "2" indicates that the model is flipped 180 degrees horizontally with respect to the stamping point, and so on.

Figure 4:
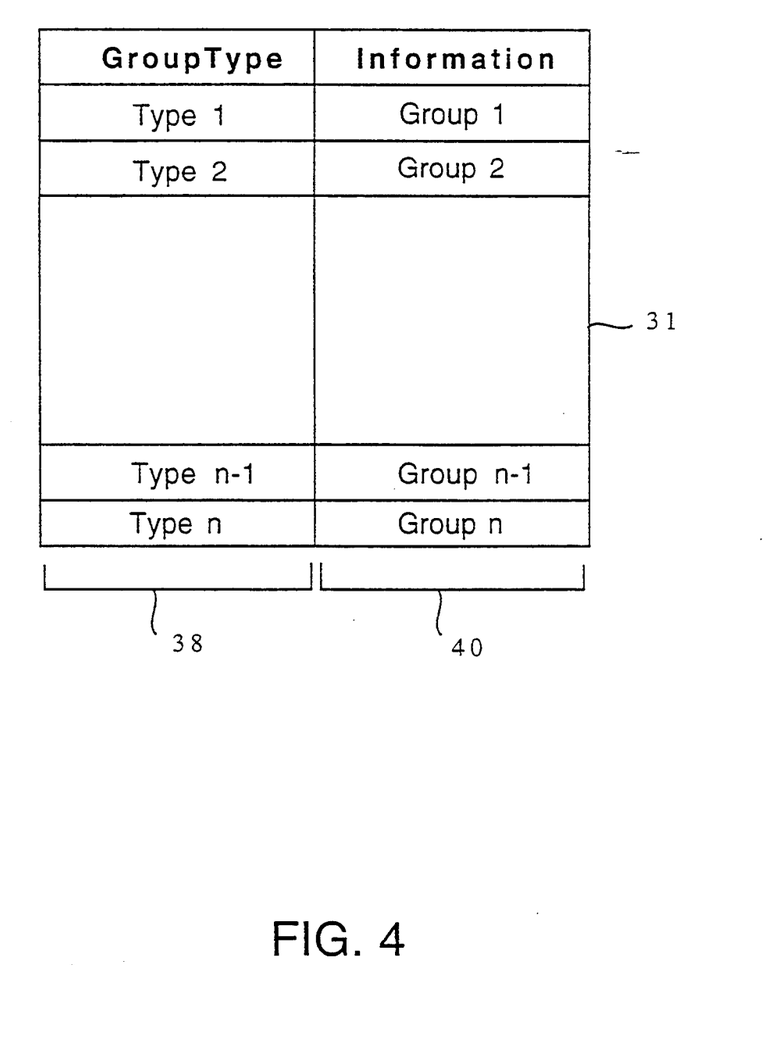
FIG. 4 is an overview memory map showing the organization of data stored in the group model register of FIG. 2.

Referring now to FIG. 4, a memory map of the group model register 31 is shown illustrating the arrangement of groups within internal memory 18 (FIG. 1). The memory map of the group model register 31 consists of two columns. The first column is a list of group types 38 where each type listing is contained within a discrete location in internal memory 18. Corresponding to the group type 38 of the first column of FIG. 4, is a column of group information 40, which contains data relating to the make-up of each of the individual group types 38. Each entry of group information 40 contains a reference to: (1) at least two shape models, (2) one or more other group models, or (3) at least one shape model and one other group model, as well as a reference to design analysis results for the corresponding group.

Figure 5:
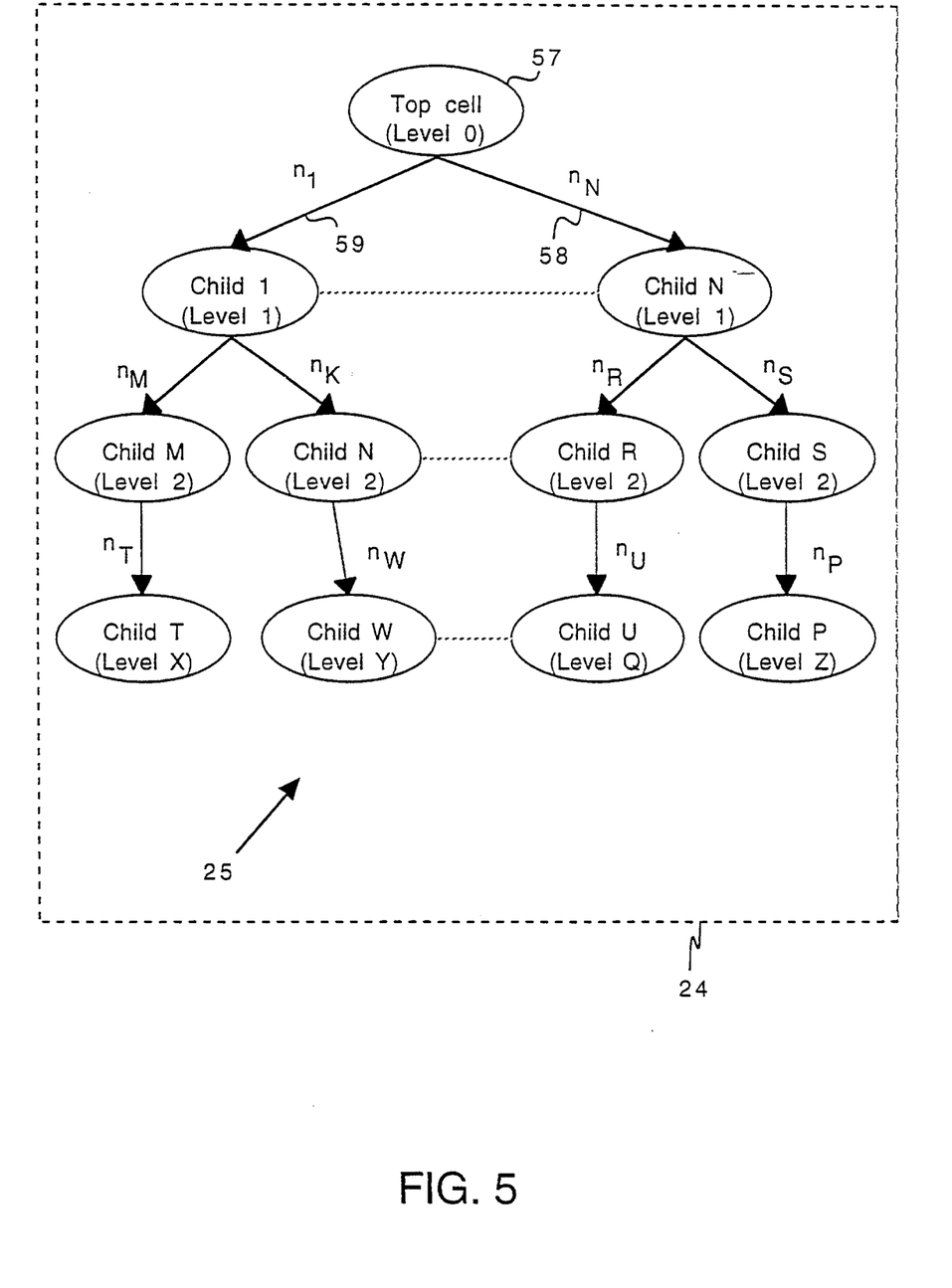
FIG. 5 is a hierarchical block diagram showing a simple reference graph including a top cell and several lower level cells.

Referring now to FIG. 5, a reference graph 25 is shown, representing in graphical form, the contents of reference graph register 24 (from FIG. 2). The reference graph is a data table conventionally used for identifying and organizing the hierarchical relationships between various cells in a layout design. One group model in the VDB 19 corresponds to each cell in the graph. FIG. 5 shows a simple reference graph 25 including a top cell 57, which is defined to be at Level 0. Internal to the description of the top cell 57 are references to a number of child cells including child 1 through child N.

Each of these child cells referenced by top cell 57 are defined to be in Level 1. Similarly, each Level 1 child may reference additional children, creating a layer of Level 2 children. Lower levels of referenced child cells are also possible as each of the Level 2 children can reference children of their own. In addition to labeling each of the cells in the reference graph 25, each path is also indexed with a data notation which identifies the number of times each child cell is referenced. For example, a path 59 is indexed with notation $n_1$, where $n_1$ represents the number of times that child 1 is referenced by its parent cell (top cell 57). The path 58 from top cell 57 to child N is indexed as $n_N$ indicating that child N is referenced by top cell 57, $n_N$ number of times. Starting with the top cell 57 and proceeding through levels 1, 2, X, Y, and through levels Q and Z, each cell of the layout is accordingly assigned a hierarchical position in VDB 19. Since any cell may occur more than once in an IC layout, the same cell may occur at multiple locations in the reference graph 25. Following one path, a specific cell may be encountered at Level 2, while going down another path, the same cell might be encountered at Level 5.

Figure 6A:
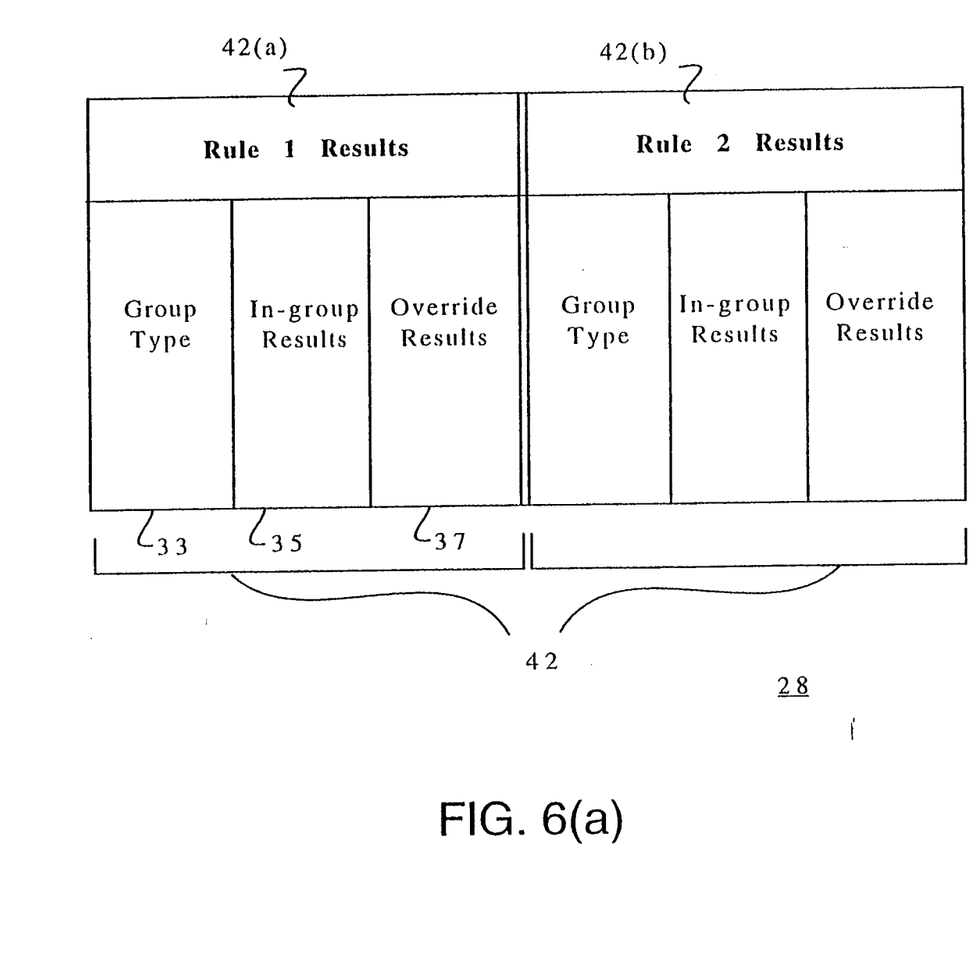
FIG. 6(a) is an overview memory map showing the organization of data stored in the results register of FIG. 2.

Referring now to FIG. 6(a), a memory map of the results register 28 (from FIG. 2) is shown. When an integrated circuit layout is analyzed with respect to processing design rules, all of the cells in reference graph 25 are evaluated and a results register 28 is created to contain the results of the analysis of each cell. The order in which the cells are analyzed does not affect the data reduction herein described. The memory map of results register 28 contains one "row" for each group model type 33 in the design, and shows a series of column sets of rule processing results 42 (separately, 42(a), and 42(b)), one for each verification rule processed. This series of column sets continues to produce N number of column sets representing N number of design rules analyzed.

The first column of rule processing results shown in column set 2(a) is the "In-group results" 35 which are derived only from the shapes within that group type. The contents of the in-group results 35 derived from a logical-OR operation in a group containing five separated shapes, for example, would be a listing of those identical five shapes. Column 37 contains override results for each group type 33. The override results 37 are produced when the spatial relationship between shapes in that group type 33 and shapes in that group type's lower level cell references is such that the lower level results are invalidated. An example of an invalid lower level result would be one in which a spacing violation is obviated by the placement of a shape in a higher-level cell overlapping the area of those shapes which violate the spacing requirement.

Figure 6B:
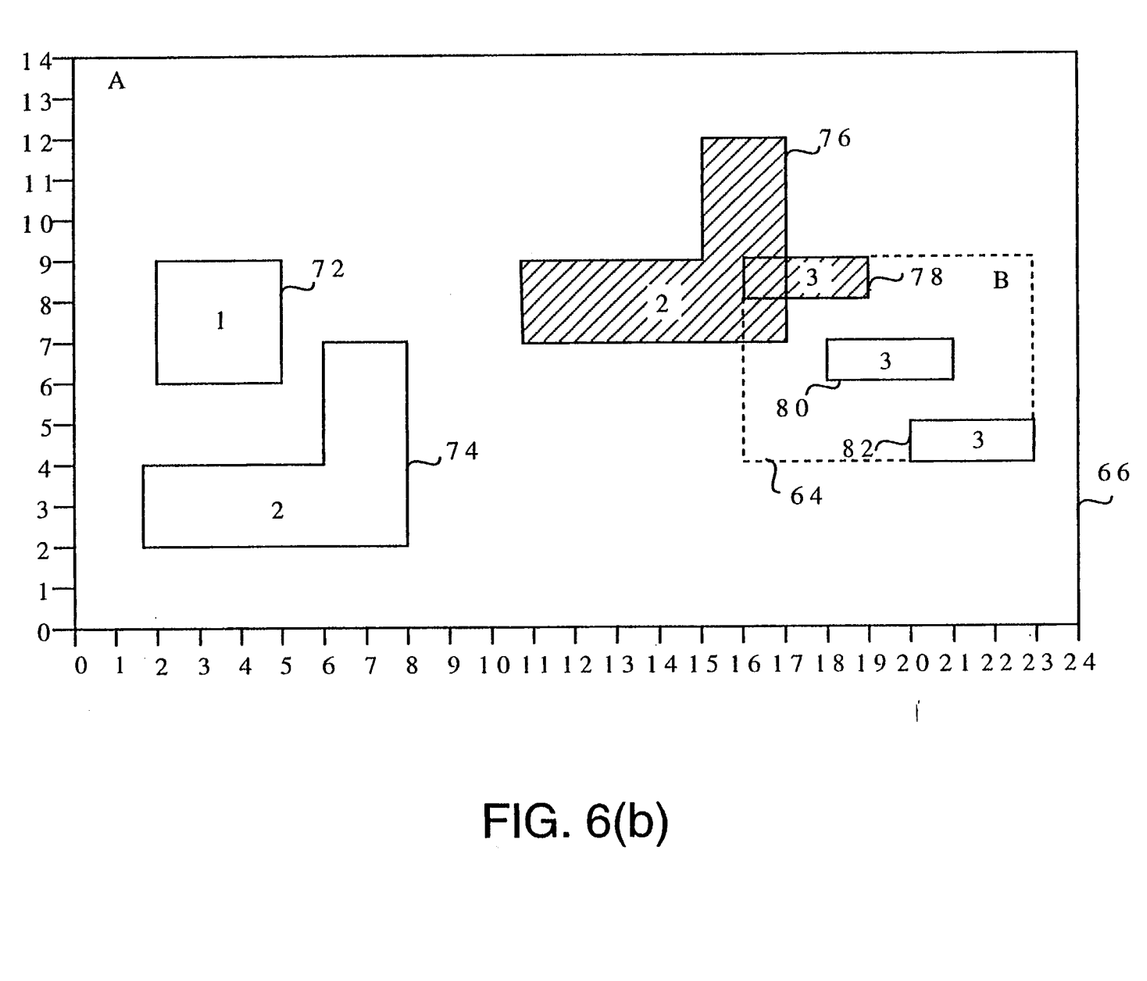
FIG. 6(b) is a geometric representation of group model data stored in the results register of FIG. 6(a)

To illustrate the various kinds of data and results, FIG. 6(b) shows an example of a group model A represented in geometric form. The group model A contains both shape models (72, 74, and 76) and another group model, B. A bounding box is the smallest rectangle which circumscribes the area of one or more polygons and/or bounding boxes. Group B's bounding box 64 is a 5×7 rectangle; it contains three identical shapes, referred to as shape 3 in the shape model library. The contents of the group information 40 for group B in the group model register 31 is as follows:

BBox: 5×7
Shape 3@0,4 Rot=0
Shape 3@2,2 Rot=0
Shape 3@4,0 Rot=0

The bounding box (BBox) is defined as having a width of seven units and a height of five units. The stamping point and orientation of the three "instances" of shape 3 are indicated by the x, y coordinate points (preceded by the "@" symbol) and rotation indicator (preceded by "ROT") in the preferred embodiment. Stamping points are at (0,4), (2,2), and (4,0), respectively. The rotation (Rot) is zero for each of the group B shapes. The three shapes comprising group model B are said to be "in" group B. Any results of operations on these in-group shapes are considered "in-group results," because they are results of operations in polygons within the group model.

Group B is contained within the larger group A cell. The group information 40 defining group A is as follows:

BBox: 24×14
Shape 1@2,6 Rot=0
Shape 2@2,2 Rot=0
Shape 2@11,7 Rot=0
Group B@16,4 Rot=0

The bounding box 66 for group A is defined as an area 24 units wide and 14 units high. A single instance of shape 1, a single instance of group B, and two instances of shape 2 are contained in group A. The shape model register 27 contains the following shape type 34 and shape information 32 relating to shapes 1, 2 and 3:

Shape 1: (0,0), (0,2), (2,2), (2,0)
Shape 2: (0,0), (0,1), (4,1), (1,5), (5,5), (5,0)
Shape 3: (0,0), (0,1), (3,1), (3,0)

Shape 1 is a square with sides having dimensions of two units. Shape 2 is a six-sided polygon, and shape 3 is a rectangle having a width of three units and a height of one unit.

An example of a rule processing function which might be performed on group A and group B is the "logical OR" operation. The OR operation in the context of a typical design rule analysis would combine any shapes which overlap or abut in any of the cells. Performing a logical OR on group B would yield the original three shapes 78, 80, and 82, when only the shapes in group B are considered. But when group B is analyzed as a component of group A, the "in-group results" for group B are no longer all valid. Rather, from group A's point of view, the results for shapes 80 and 82 of group B are still valid while the result for shape 78 of group B must be overridden. The higher-level shape 76 in group A has a spatial relationship with lower-level shape 78 such that the result of shape 78 is invalidated, and the combined shape (shaded area) is entered into group A's (group type 33) override result 37 list. Specifically, the logical OR of shape 78 in group B and shape 76 in group A is an "override result," and the logical-OR causes the lower-level shape to be "overridden."

As discussed above, each row of group type 33 entries in the results register 28 is subdivided into two sections, one for in-group results 35, and one for override results 37. Lower-level results which are not invalidated in the analysis by higher-level shapes are referred to as implicit results. These results are contained in the lower-level references of the results register 28. By storing implicit results in this way, a tremendous savings in data base storage space can be achieved.

The final element of VDB 19 shown in FIG. 2, is the rain relationship register 26. The rain relationship register 26 contains the hierarchical relationships between cells which are originally generated and stored in reference graph register 24, and further incorporates information identifying possible interaction between groups. A detailed description of rain relationship register 26 is provided in the related prior patent application, Ser. No. 08/064,854.

Figure 7:
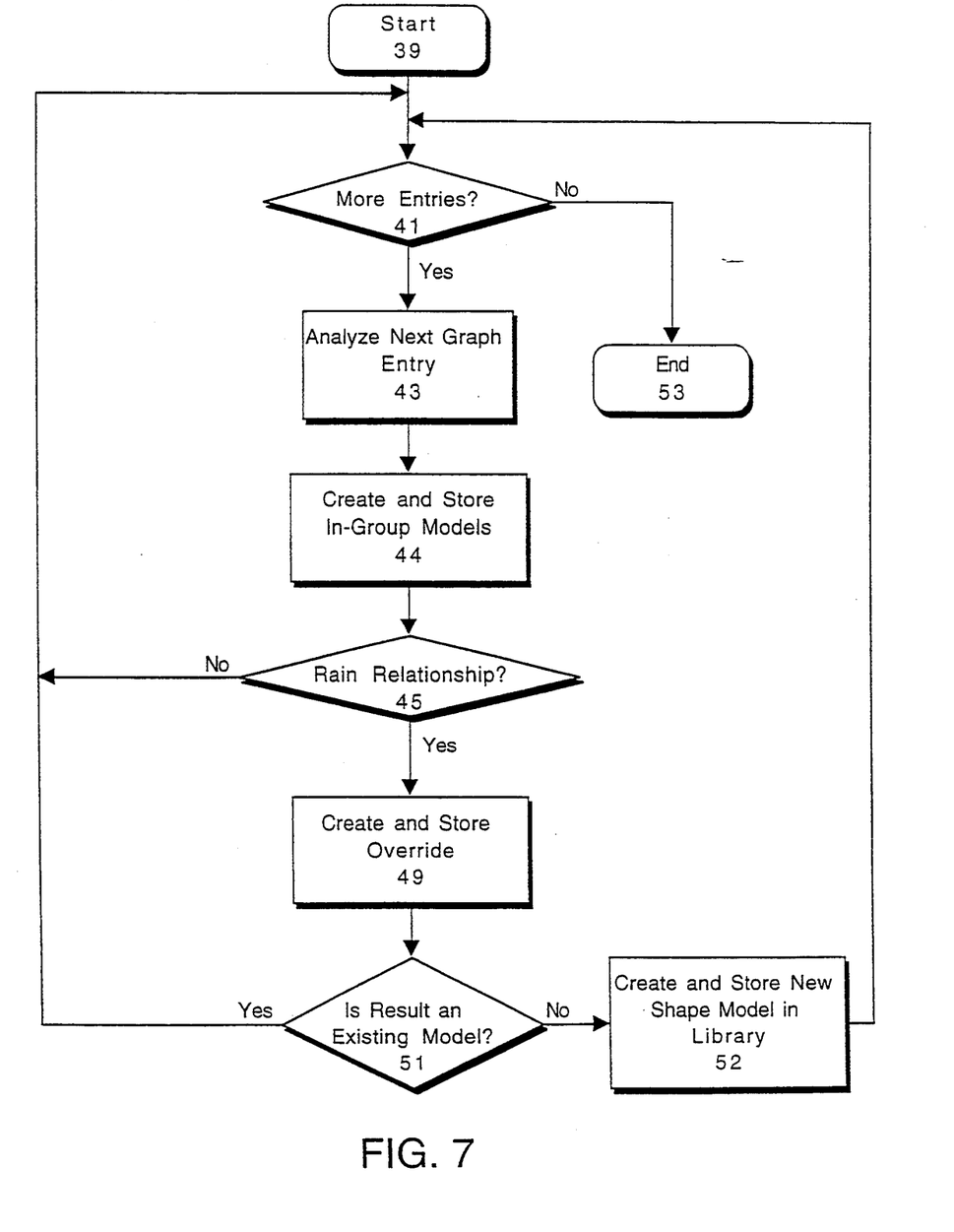
FIG. 7 is a flowchart showing the method steps of the present invention for creating a reduced data set while analyzing reference graph components with respect to design rules.

Referring now to FIG. 7, a flow chart is shown which outlines the method steps for storing IC design analysis results in the results register 28 of FIG. 6(a). Beginning in step 39, CPU 15 starts the analysis of the IC layout with respect to a specific design rule. Reference graph register 24 entries (these are equivalently the individual group types 33 of results register 28) are sequentially selected in step 41 and conventionally analyzed with respect to a specific design rule in step 43. In-group results created 44 from this analysis are stored in in-group results register 35. The computer software program Dracula® from Cadence Design Systems, San Jose, Calif., is an example of programmed instruction steps which are stored in program memory 17 and executed by CPU 15 for analyzing design rules.

Following analysis of the design rule, with respect to in-group data, CPU 15 determines in step 45 whether a rain relationship exists between the current reference graph register 24 entry and any of its lower level cell references. If no such relationship exists, that is, if the individual shape in the current reference graph 25 entry does not have the potential to generate override results 37, then no action is taken and CPU 15 returns to step 41 to evaluate the next reference graph 25 entry.

If, instead, the shapes from the current reference graph 25 entry do interact with lower-level shapes in such a manner as to impact the results of the analysis of those lower-level shapes, then the previous lower-level results are overridden in step 49. A reference to the override result is stored as an override result 37, and the result shape itself is placed in the shape model register 27 if it does not yet exist. Since this override entry replaces a specific shape or shapes from a cell reference lower in the design hierarchy than the current reference graph register 24 entry, the override result list must also include reference to the specific shapes replaced. Each such reference is defined by a shape model identifier, a stamping point and a rotation. Specifically, when an override result 37 is added to the results register 28, any further processing with the result as input will ignore the specified shape from below. Following the creation and storage 49 of the override result 37 in the results register 28, any newly created shape models must be stored in the shape model register 27. In step 51 a determination is made as to whether the new override shape has been previously stored in shape model register 27 as a library shape. If the shape has been previously added, the existing model is referenced, and this reference is added as an override result 37 entry associated with the group type 33 being evaluated. The CPU 15 then begins processing the next reference graph 25 entry again in step 41.

If it is determined in step 51 that the resulting shape has not been previously stored in shape model register 27, the new shape is then stored 52 into the shape register. The new shape type 34 is used to represent the shape as an override result 37, of which it is a component. Following the storing of the shape model in step 52, the CPU 15 then begins processing the next reference graph entry again in step 41.

Figure 8:
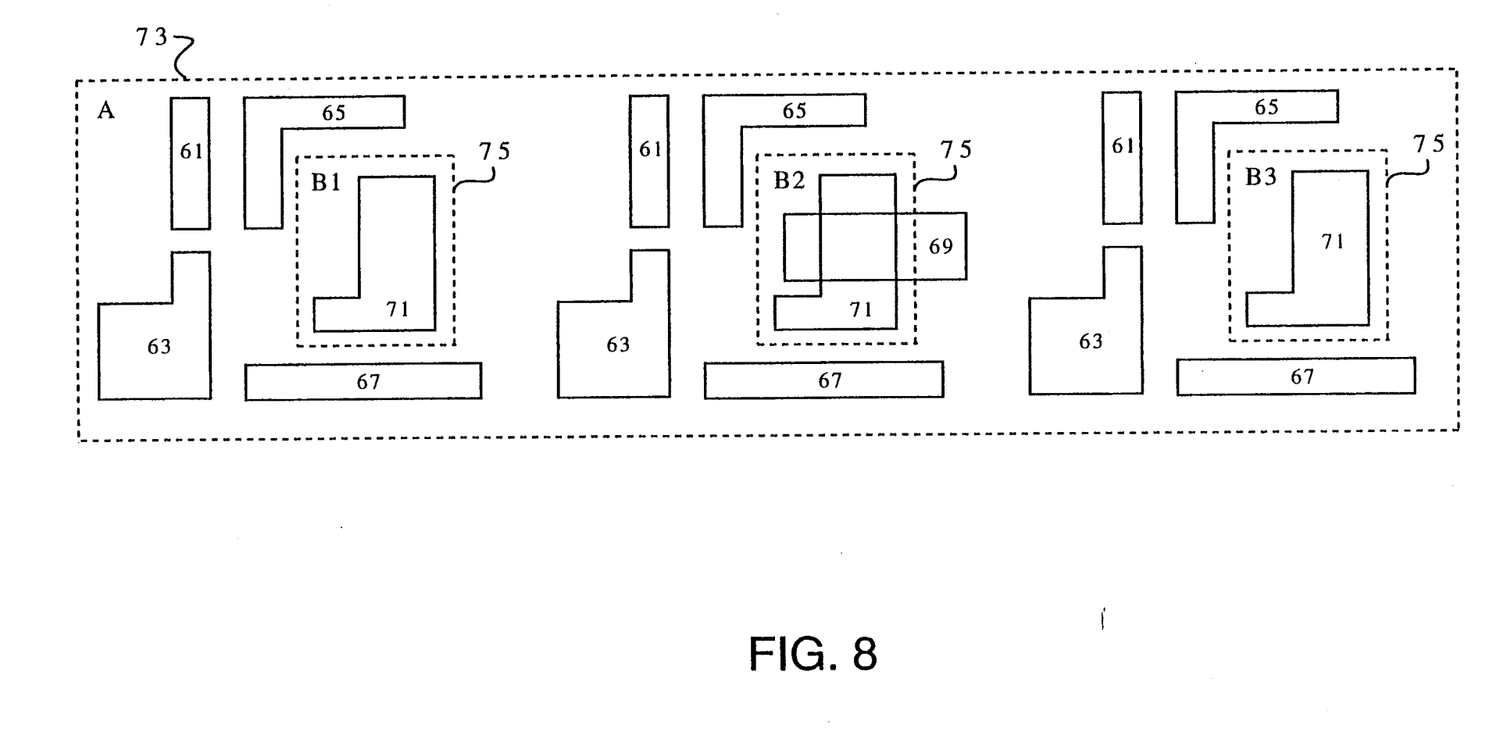
FIG. 8 is a diagram of a sample integrated circuit layout, showing a collection of component shapes, one of whose three lower-level instances is intruded upon by a higher-level shape in the design.

Referring now to FIG. 8, an example is shown in which shapes typical of an integrated circuit layout are arranged to form electrical circuit elements 61, 63, 65, 67, 69, and 71. The first four shapes (61–67) are each placed three times in the cell marked "A", whose bounding box 73 is depicted as a dashed rectangle surrounding the shapes. Shape 69 is placed once in A. Group A also references three instances of group B (B1, B2, and B3). The bounding box 75 for B is depicted by the dashed line surrounding shape 71. Shape 71 is the sole shape contained by group B.

Figure 9:
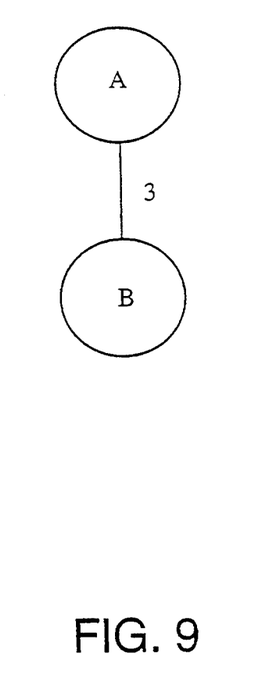
FIG. 9 is a reference graph of the design of FIG. 8.

The reference graph for the circuit layout of FIG. 8 is pictorially shown in FIG. 9. The reference graph contains all groups in the design, namely groups A and B, with group B shown referenced three times by group A. A rain relationship exists between shape 69 of group A and group B2, because shape 69 covers some portion of the area within group B's bounding box 75.

Figure 10:
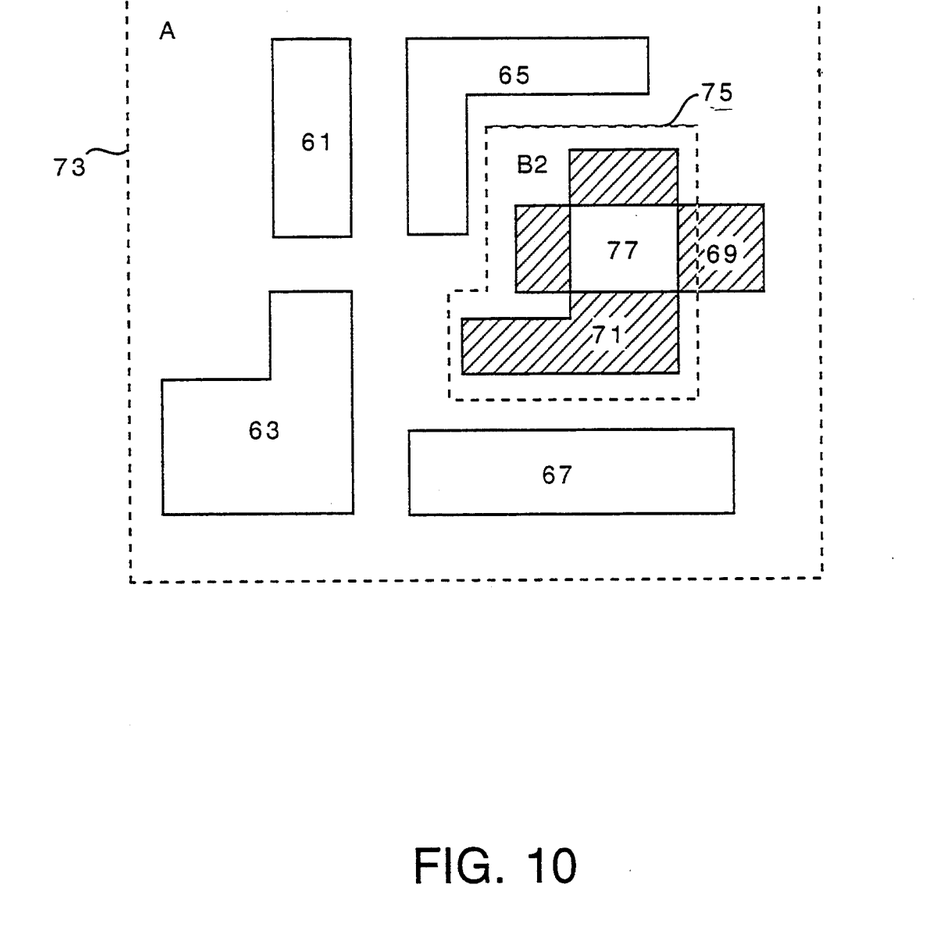
FIG. 10 is a partial layout diagram detailing the result of the analysis of the second instance of cell B in FIG. 8 according to the rules of an XOR operation, using the method of the present invention.

Referring now to FIG. 10, a partial layout diagram of FIG. 8 is shown, illustrating an example design rule analysis in which an exclusive-OR (XOR) of the shapes of FIG. 8 is calculated. The exclusive-OR is defined as a logical binary operation in which two or more logical operands are compared, producing a logical "1" if any but not all of the operands are in a "1" state, and producing a logical "0" otherwise. For shapes 69 and 71 in FIG. 10, the shaded areas represent an area which is circumscribed by the area of one shape (69) or the other (71), but not both. (Note that the center 77 is unshaded, since this center area is circumscribed by both shapes 69 and 71.)

When the group being analyzed is group A, the in-group data for shapes 61, 63, 65 and 67 are first processed with respect to the XOR operation. The results created from this operation are the shapes 61, 63, 65 and 67. The resulting shapes are entered as in-group results 35. Next, a rain-relationship is noted (as in step 45 of FIG. 7) between shape 69 in group A and shape 71 in lower-level group B. The XOR operation will modify shape 71 by virtue of its interaction with shape 69 in the higher level above it in the hierarchy. Thus, two entries need to be created: an "override" which tells subsequent processors of group B2 to ignore shape 71 in this specific context of group A; and an "override result" which is a shape or shapes representing the shaded result area. The override shapes are placed in the override results 37 register of group type (33) A (representing cell A results) in this example, and is stored as a reference to shape 71. For all other placements of group B 75 which do not have the shape 69 intruding upon them from parent group A (B1 and B3), results existing within B are implicit results that are true for A because A references B.

The invention has now been explained with reference to specific embodiments. Other embodiments will be apparent to those of ordinary skill in the art in light of this disclosure. Therefore it is not intended that this invention be limited, except as indicated by the appended claims.

What is claimed is:

1. A method for data storage requirement reduction in a system for analyzing a geometric database, wherein the method comprises the steps of:
    (a) reading a listing of group models comprising the geometric database;
    (b) performing a design rule verification upon a set of shape models referenced by a first group model within the listing with respect to a specific design rule, thereby generating an in-group result where the in-group result is derived from the set of shape models found within the first group model;

(c) determining whether a rain relationship exists, the rain relationship existing when a spatial relationship between a shape model within the first group model invalidates a lower-level verification result; and (d) creating an override result if a rain relationship exists wherein the override result references a shape model created during a design rule verification performed upon the, shape models causing the rain relationship, wherein those shape models not changed as a result of a design rule verification result are not duplicated in said geometric database.

2. The method for data storage requirement reduction according to claim 1, wherein the design rule analysis of step (b) is performed according to a conventional software program.

3. The method for data storage requirement reduction according to claim 1, wherein if it is determined in step (c) that no rain relationship exists, a next group model is analyzed in step (b).

4. The method for data storage requirement reduction according to claim 1, wherein the step of analyzing the first group model with respect to a specific design rule further comprises the step of creating and storing in-group results.

5. The method for data storage requirement reduction of claim 1, further comprising the step of:
(e) storing a newly-created shape model corresponding to an override shape in a shape model register.

6. The method for data storage requirement reduction of claim 1, further comprising the step of:
(e) repeating steps (b) through (d) for a next group model in the geometric database.

7. A means for data storage requirement reduction in a system for analyzing a geometric database, wherein the means for data storage requirement reduction comprises:

means for reading a listing of group models comprising the geometric database;

means for performing a design rule verification upon a set of shape models referenced by a first group model within the listing with respect to a specific design rule, thereby generating an in-group result, where the in-group result is derived from the set of shape models found within the first group model;

means for determining whether a rain relationship exists, in relationship existing when a spatial relationship between a shape model within the first model invalidates a lower-level verification result; and means for creating an override result if a rain relationship exists, wherein the override result references a shape model created during a design rule verification performed upon those shape models causing, the rain relationship.

wherein those shape models not changed as a result of a design rule verification result are not duplicated in said geometric database.

8. The means for data storage requirement reduction of claim 7, further comprising a means for storing a newly-created shape model corresponding to an override shape in a shape model register.

* * * * *